(12) United States Patent
Lin et al.

(10) Patent No.: US 10,186,469 B1
(45) Date of Patent: Jan. 22, 2019

(54) CLAMPING COMPONENT FOR CLAMPING A CHIP MODULE

(71) Applicant: LOTES CO., LTD, Keelung (TW)

(72) Inventors: Gui Bin Lin, Keelung (TW); Ji Xiao Yu, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/867,926

(22) Filed: Jan. 11, 2018

(30) Foreign Application Priority Data

Jul. 24, 2017 (CN) .......................... 2017 1 0607360

(51) Int. Cl.
| | |
|---|---|
| *H05K 1/00* | (2006.01) |
| *H01L 23/32* | (2006.01) |
| *H05K 7/10* | (2006.01) |
| *H01R 13/64* | (2006.01) |
| *H01R 12/70* | (2011.01) |

(52) U.S. Cl.
CPC ............. *H01L 23/32* (2013.01); *H05K 7/103* (2013.01); *H01R 12/7023* (2013.01); *H01R 13/64* (2013.01)

(58) Field of Classification Search
CPC ..... H01L 23/32; H01R 12/7023; H01R 13/64; H01R 13/2442; H05K 7/103
USPC .................................... 439/55, 526; 206/724
See application file for complete search history.

(56) References Cited

U.S. PATENT DOCUMENTS

| | | | | |
|---|---|---|---|---|
| 6,579,120 | B2 * | 6/2003 | Abbott ................. | H05K 7/1007 439/526 |
| 7,666,029 | B2 * | 2/2010 | Lin ....................... | G01R 1/0458 439/526 |
| 9,270,035 | B2 * | 2/2016 | Yeh ........................... | H05K 7/10 |
| 2016/0149322 | A1 * | 5/2016 | Peng .................. | H01R 12/7076 439/626 |

FOREIGN PATENT DOCUMENTS

| | | |
|---|---|---|
| CN | 201113145 Y | 9/2008 |
| CN | 202394889 U | 8/2012 |
| CN | 103490227 A | 1/2014 |
| CN | 204243357 U | 4/2015 |
| CN | 204809489 U | 11/2015 |
| CN | 205104654 U | 3/2016 |
| CN | 205983368 U | 2/2017 |
| CN | 205985686 U | 2/2017 |
| CN | 206098917 U | 4/2017 |

* cited by examiner

*Primary Examiner* — Tulsidas C Patel
*Assistant Examiner* — Travis Chambers
(74) *Attorney, Agent, or Firm* — Locke Lord LLP; Tim Tingkang Xia, Esq.

(57) ABSTRACT

A clamping component is provided to clamp a chip module, which has a circuit board and a protruding portion protruding upward from an upper surface thereof. In a left-right direction, a width of a first region from a left side of the circuit board to a left side of the protruding portion is greater than that of a second region from a right side of the circuit board to a right side of the protruding portion. Two abutting surfaces respectively abut the left and the right sides of the circuit board. A stopping block is located at a left side of an opening, and extends rightward to the left side of the protruding portion and beyond the left side of the circuit board. When the chip module is installed in the clamping component and the circuit board abuts the abutting surfaces, the stopping block is located above the first region.

10 Claims, 8 Drawing Sheets

CLAMPING COMPONENT FOR CLAMPING A CHIP MODULE

CROSS-REFERENCE TO RELATED PATENT APPLICATION

This application claims priority to and the benefit of, pursuant to 35 U.S.C. § 119(a), patent application Serial No. CN201710607360.1 filed in China on Jul. 24, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a clamping component, and in particular, to a clamping component configured to clamp a chip module.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In Chinese Patent No. 201620664775.3, an electrical connector assembly is disclosed. The electrical connector assembly includes: an electrical connector that is provided with a plurality of terminals configured to electrically connect to a chip module; and a carrier, configured to carry the chip module to be assembled in the electrical connector, to avoid that when a user manually assembles the chip module in the electrical connector, the chip module falls and breaks the terminals due to an improper operation. The carrier is provided with a plurality of clamping portions for clamping the chip module. Each clamping portion is provided with a protruding post. The protruding post enters a corresponding notch at the edge of the chip module to limit the chip module. By matching the protruding post and the notch, the chip module is prevented from being mistakenly assembled in the carrier, thereby ensuring desirable electrical conduction between the chip module and the terminals.

Nevertheless, to reduce the resisting force during assembly of the chip module in the carrier, the clamping portion generally has good elasticity. However, the protruding post is disposed on the clamping portion, and even if the chip is mistakenly assembled, that is, the notch and the protruding post are misplaced, another position of the edge of the chip module may extrude the protruding post, so that the clamping portion springs to make space for the chip module. Therefore, the chip module may be forcibly misplaced and assembled in the clamping component, and it is not easy for an operator to perceive the mistaken operation.

Therefore, a heretofore unaddressed need to design an improved clamping component exists in the art to address the aforementioned deficiencies and inadequacies.

SUMMARY

In view of the problem addressed in the background technology, an objective of the present invention is to provide a clamping component that prevents a chip module from being mistakenly assembled.

To achieve the foregoing objective, the following technical solutions are used in the present invention. A clamping component is provided, configured to clamp a chip module. The chip module has a circuit board and a protruding portion protruding upward from an upper surface of the circuit board, wherein a region from a left side of the circuit board to a left side of the protruding portion is defined as a first region, a region from a right side of the circuit board to a right side of the protruding portion is defined as a second region, and a width of the first region in a left-right direction is greater than a width of the second region in the left-right direction. The clamping component includes: an opening, configured to accommodate the chip module; a first abutting surface and a second abutting surface, respectively located at a left side and a right side of the opening, and configured to respectively abut the left side and the right side of the circuit board to limit movement of the circuit board in the left-right direction; and a stopping block, located at the left side of the opening, and extending rightward to the left side of the protruding portion and extending beyond the left side of the circuit board, wherein when the chip module is installed in the clamping component and the circuit board abuts the first abutting surface and the second abutting surface, the stopping block is located above the first region, and a distance between a right side surface of the stopping block and the first abutting surface in the left-right direction is greater than the width of the second region in the left-right direction, and is shorter than or equal to the width of the first region in the left-right direction.

In certain embodiments, the stopping block abuts the first region.

In certain embodiments, the clamping component is provided with a limiting portion extending rightward and beyond the left side of the protruding portion, the limiting portion is located above an upper surface of the protruding portion, and a distance between a bottom surface of the limiting portion and a bottom surface of the stopping block is greater than a distance between the upper surface of the protruding portion and the upper surface of the circuit board, so that the limiting portion is not in contact with the upper surface of the protruding portion.

In certain embodiments, the stopping block is at least partially located right below the limiting portion.

In certain embodiments, a length of the limiting portion in a front-rear direction is equal to a length of the stopping block in the front-rear direction.

In certain embodiments, a gap between the right side surface of the stopping block and the left side of the protruding portion is smaller than the width of the second region in the left-right direction.

In certain embodiments, two stopping blocks are provided at the left side of the opening, the first abutting surface is located between the two stopping blocks, and gaps between the first abutting surface and the two stopping blocks are not equal.

In certain embodiments, the clamping component is provided with at least one protruding block at the right side of the opening, and the protruding block downward abuts the second region.

In certain embodiments, the left side and the right side of the opening respectively extend downward to form two elastic arms, side surfaces of the two elastic arms opposite to each other respectively form the first abutting surface and the second abutting surface, and an end of each of the two elastic arms is bent to form a hook that hooks a lower surface of the circuit board.

In certain embodiments, each of the elastic arms is provided with a protruding post, the protruding post is provided with an arc surface, the left side of the circuit board is provided with a notch matching the arc surface, and the stopping block is closer to the left side of the protruding portion than the protruding post.

Compared with the related art, the present invention has the following beneficial effects.

The distance between the right side surface of the stopping block and the first abutting surface in the left-right direction is greater than the width of the second region in the left-right direction, and is shorter than or equal to the width of the first region in the left-right direction. Thus, the stopping block can enter only the first region and not the second region. Therefore, when an operator installs the chip module in the clamping component in an incorrect reverse left-right direction, the stopping block is located above the second region, and the stopping block abuts the protruding portion during a process in which the chip module moves upward, so that the clamping component cannot clamp the chip module, allowing the operator to find in time that the chip module is installed in the incorrect direction, and thereby ensuring correctness of the direction in which the clamping component clamps the chip module.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated. As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to a method for manufacturing a clamping component.

Figure 1:
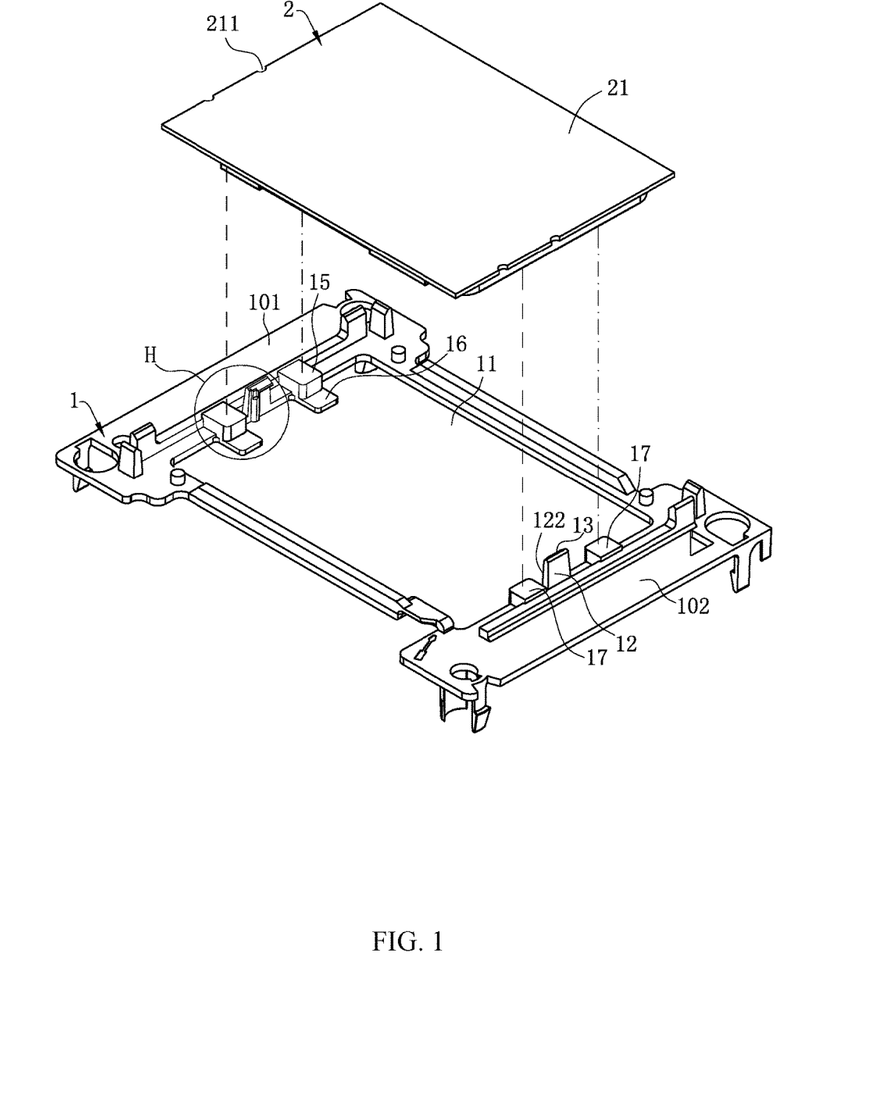
FIG. 1 is a perspective exploded view of a clamping component and a chip module according to certain embodiments of the present invention.
Figure 2:
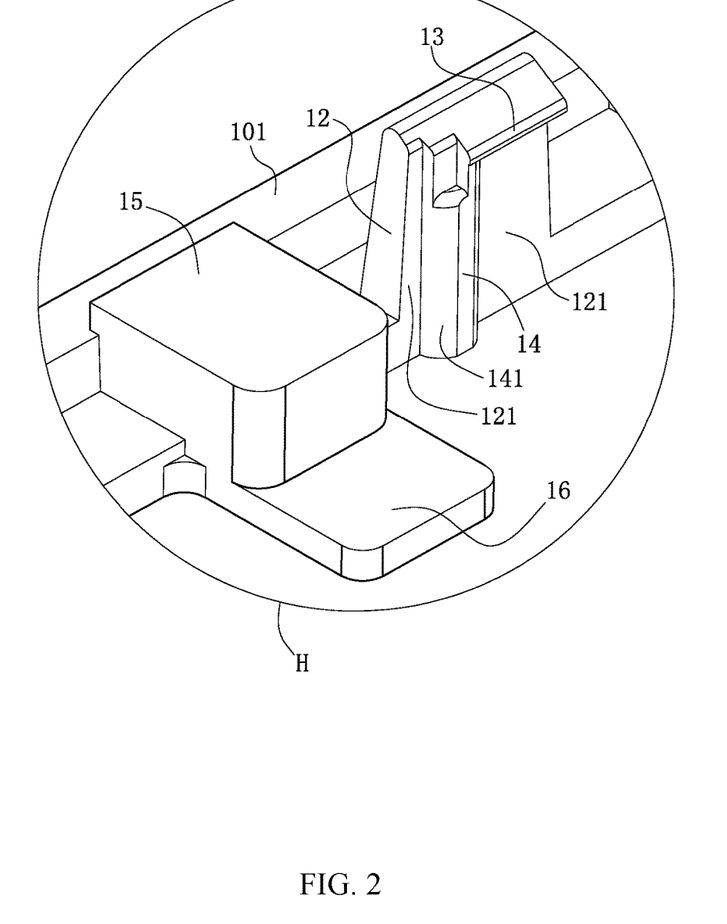
FIG. 2 is an enlarged view of part H in FIG. 1.
Figure 3:
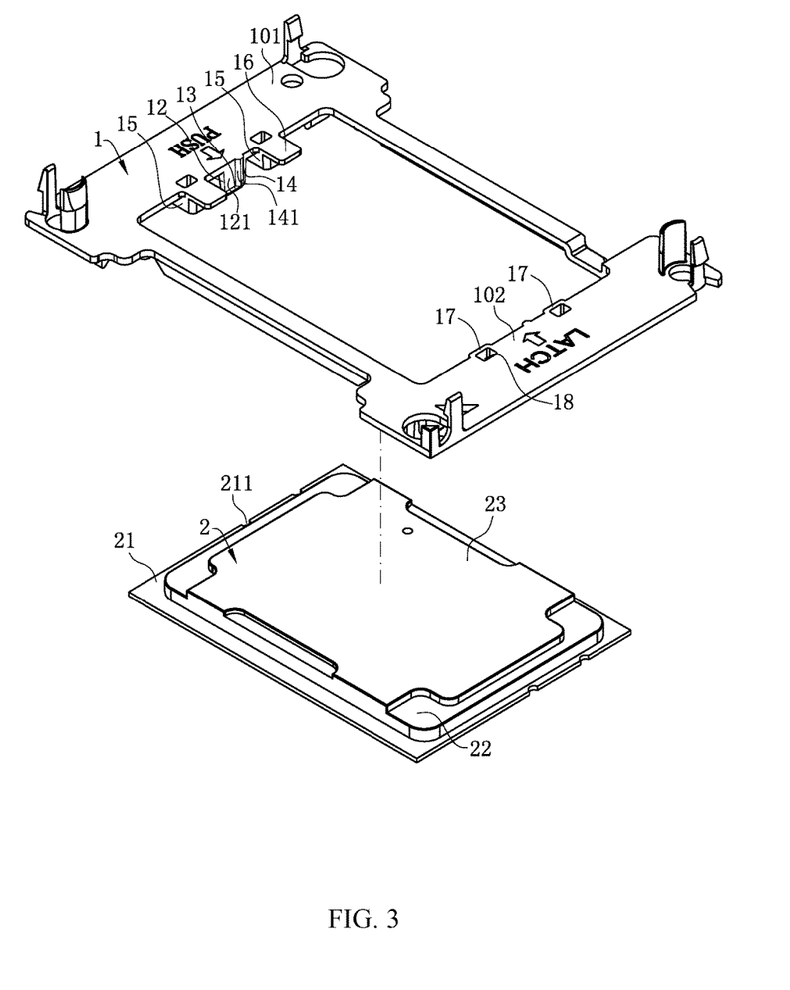
FIG. 3 is a perspective exploded view of a clamping component and a chip module from another viewing angle according to certain embodiments of the present invention.

As shown in FIG. 1 to FIG. 3, a clamping component 1 in the present invention is configured to clamp a chip module 2, so as to connect the chip module 2 to an electrical connector (not shown in the figures, similarly hereinafter). In this embodiment, to reduce costs and lower the weight, the clamping component 1 is made of plastic. In another embodiment, the clamping component 1 may be made of metal or any other material, provided that the clamping component 1 can stably clamp the chip module 2.

Figure 4:
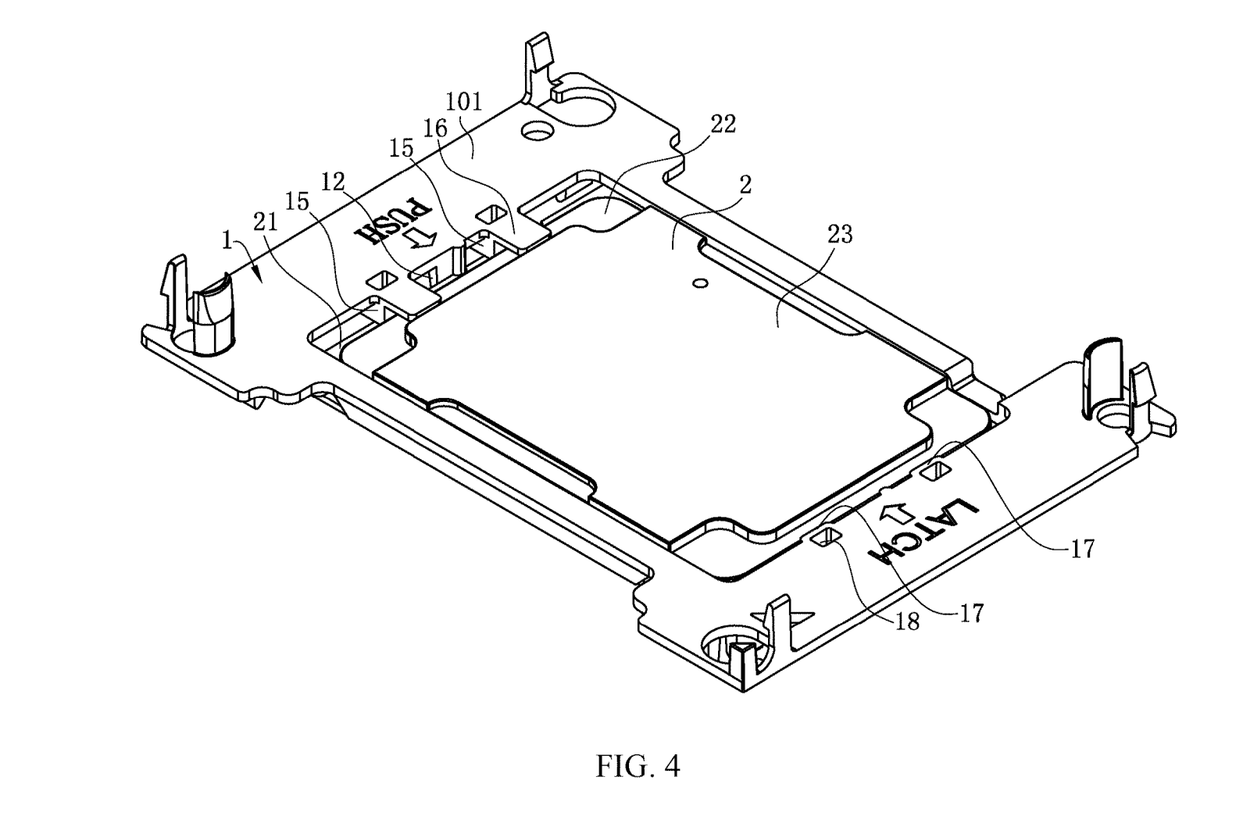
FIG. 4 is a perspective view after a clamping component clamps a chip module according to certain embodiments of the present invention.

As shown in FIG. 3 and FIG. 4, the chip module 2 includes a circuit board 21 and a protruding portion 22 protruding upward from an upper surface of the circuit board 21. In this embodiment, the circuit board 21 is in a rectangular shape. For easy of description below, a direction of a long side of the circuit board 21 is defined as a left-right direction, and a direction of a short side of the circuit board 21 is defined as a front-rear direction.

Figure 7:
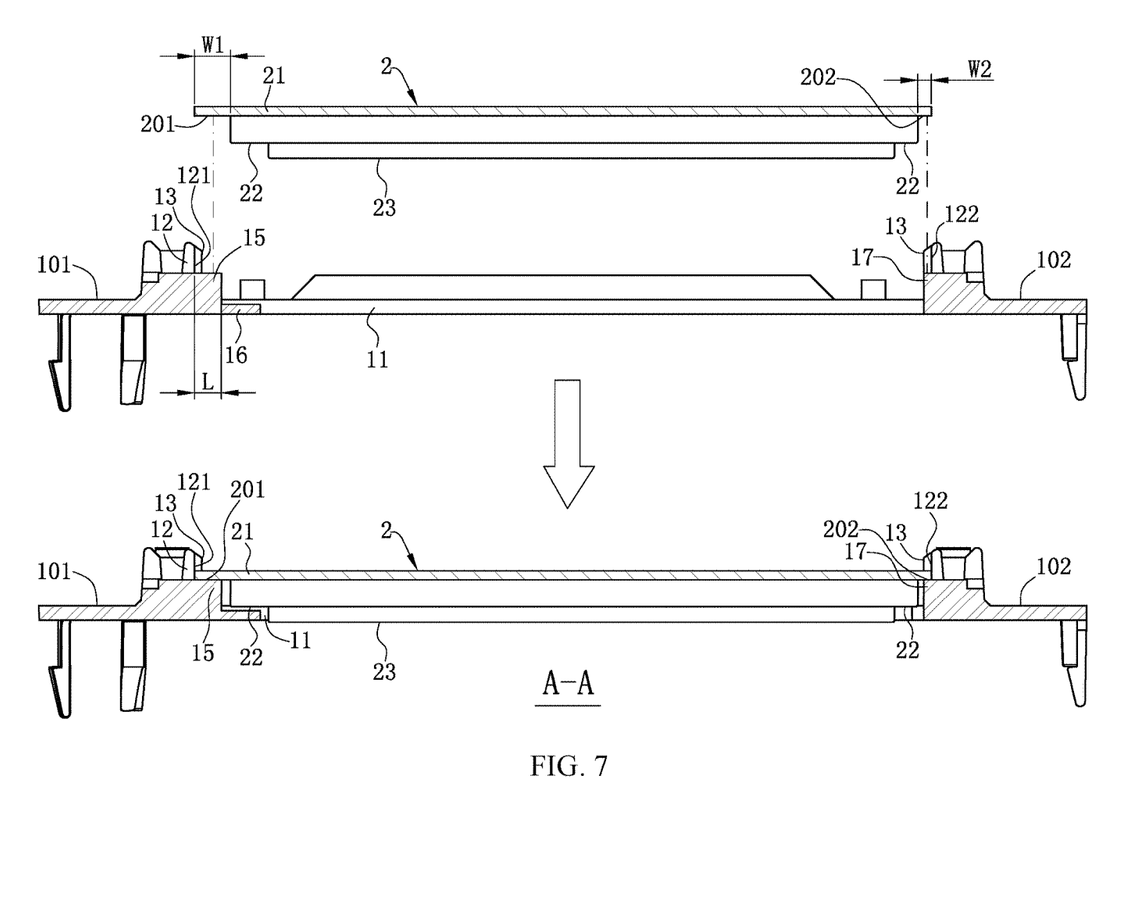
FIG. 7 is a schematic cross-sectional view of an assembly process of a clamping component taken along line A-A according to certain embodiments of the present invention.

As shown in FIG. 3 and FIG. 7, a region from a left side of the circuit board 21 to a left side of the protruding portion 22 is defined as a first region 201, and a region from a right side of the circuit board 21 to a right side of the protruding portion 22 is defined as a second region 202. A width W1 of the first region 201 in the left-right direction is greater than a width W2 of the second region 202 in the left-right direction. Further, the protruding portion 22 continues to protrude upward and forms a heat dissipating portion 23. The heat dissipating portion 23 is attached to a heat sink (not shown in the figures, similarly hereinafter), so that heat generated in the operation of the chip module 2 can be rapidly dissipated by the heat sink, thereby avoiding that the chip module 2 crashes when operating in an excessively high temperature. In addition, notches 211 are formed at the left side and the right side of the circuit board 21.

Figure 5:
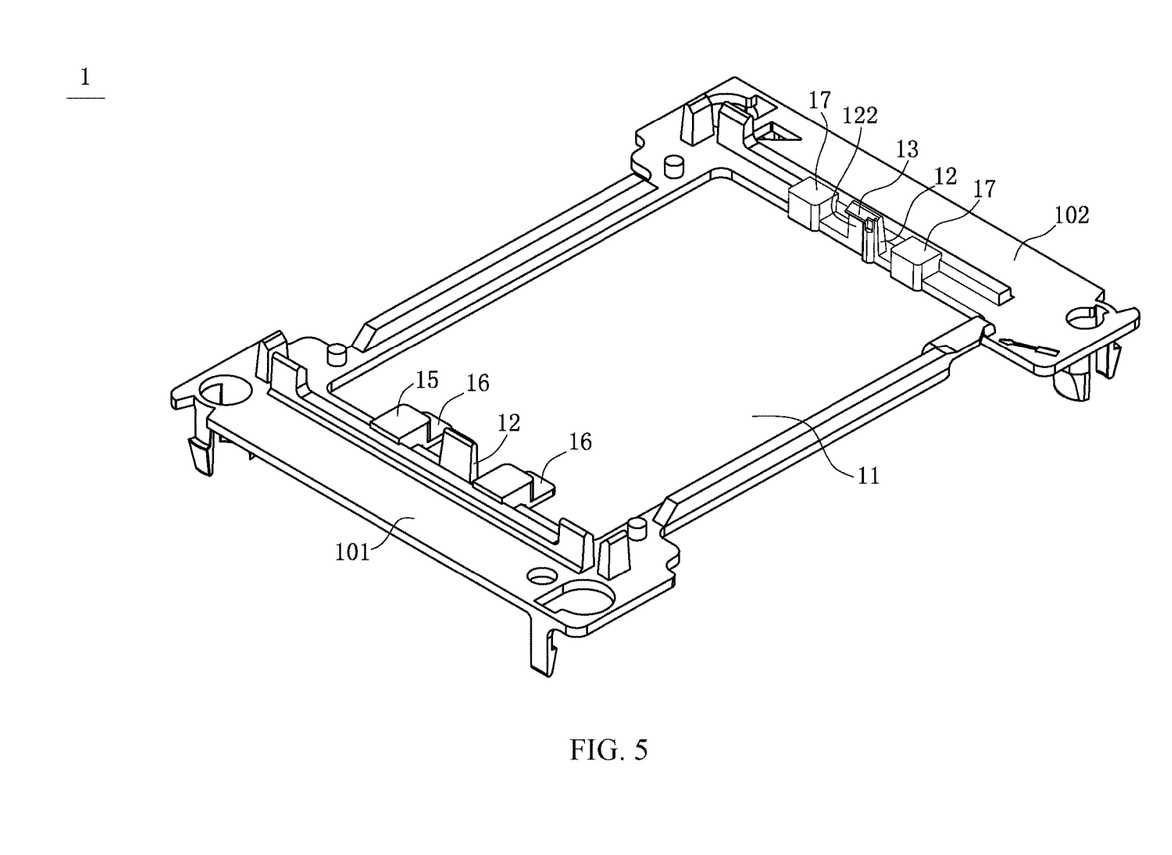
FIG. 5 is a perspective view from another viewing angle before a clamping component clamps a chip module according to certain embodiments of the present invention.

As shown in FIG. 2, FIG. 3, and FIG. 5, the clamping component 1 has an opening 11. The protruding portion 22 and the heat dissipating portion 23 run through the opening 11, so that the heat sink is attached to the heat dissipating portion 23. The clamping component 1 is provided with a first frame 101 and a second frame 102 respectively at a left side and a right side of the opening 11. The first frame 101 and the second frame 102 respectively extend downward to form two elastic arms 12. A first abutting surface 121 and a second abutting surface 122 are formed respectively at side surfaces of the two elastic arms 12 opposite to each other. The first abutting surface 121 and the second abutting surface 122 respectively abut the left side and the right side of the circuit board 21 to limit movement of the circuit board 21 in the left-right direction. A hook 13 is formed at an end of each elastic arm 12 and hooks a lower surface of the circuit board 21. Further, each elastic arm 12 is provided with a protruding post 14 corresponding to one of the notches 211. The protruding post 14 is provided with an arc surface 141. The protruding post 14 enters the corresponding notch 211, so that the arc surface 141 matches the notch 211 to limit movement of the circuit board 21 in the front-rear direction. In this way, the first abutting surface 121 and the second abutting surface 122 abut the circuit board 21 in the left-right direction, the arc surface 141 limits movement of the circuit board 21 in the front-rear direction, and the hook 13 clamps upward the circuit board 21, so that the chip module 2 is stably clamped by the clamping component 1, thereby avoiding that the chip module 2 moves in the clamping component 1.

Figure 6:
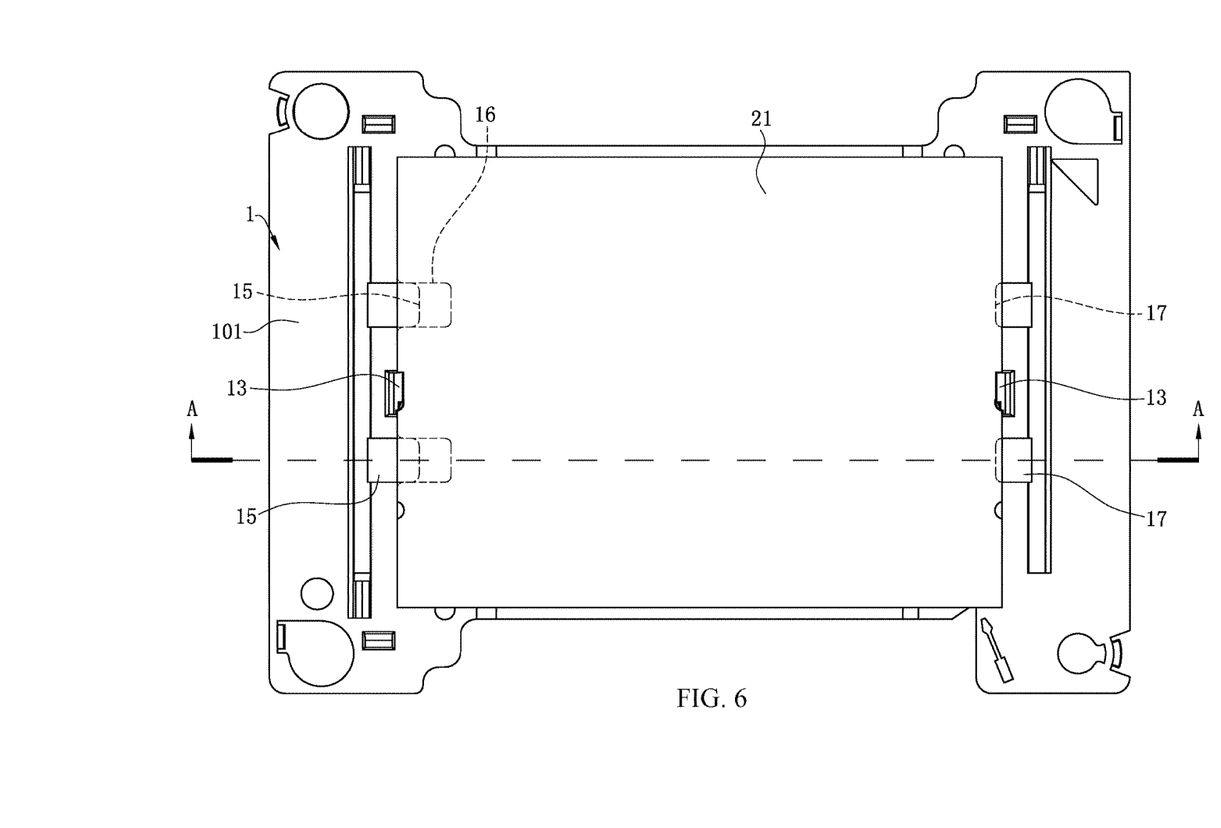
FIG. 6 is a bottom view after a clamping component clamps a chip module according to certain embodiments of the present invention.

As shown in FIG. 4 to FIG. 6, the first frame 101 extends rightward beyond the left side of the protruding portion 22, forming two parallel limiting portions 16. The limiting portions 16 are located above an upper surface of the protruding portion 22. The first frame 101 extends rightward beyond the left side of the circuit board 21, forming two stopping blocks 15. The stopping blocks 15 are located above the first region 201 and downward abut the first region 201. A distance between a bottom surface of the limiting portion 16 and a bottom surface of each stopping block 15 is greater than a distance between the upper surface of the protruding portion 22 and the upper surface of the circuit board 21, so that the limiting portion 16 is not in contact with the upper surface of the protruding portion 22. Each stopping block 15 is partially located right below the limiting portion 16, and a remaining portion of each stopping block 15 is located below the first frame 101. Each stopping block 15 is connected to the limiting portion 16. In addition, a length of the limiting portion 16 in the front-rear direction is equal to a length of the stopping block 15 in the front-rear direction, thereby increasing the strength of the limiting portion 16. In another embodiment, the stopping blocks 15 and the limiting portion 16 may be disposed in a staggered manner. Further, the first abutting surface 121 is located between the two stopping blocks 15, and gaps between the first abutting surface 121 and the two stopping blocks 15 are not equal. An upper surface of the limiting portion 16 and an upper surface of the first frame 101 are located in a same plane.

Figure 8:
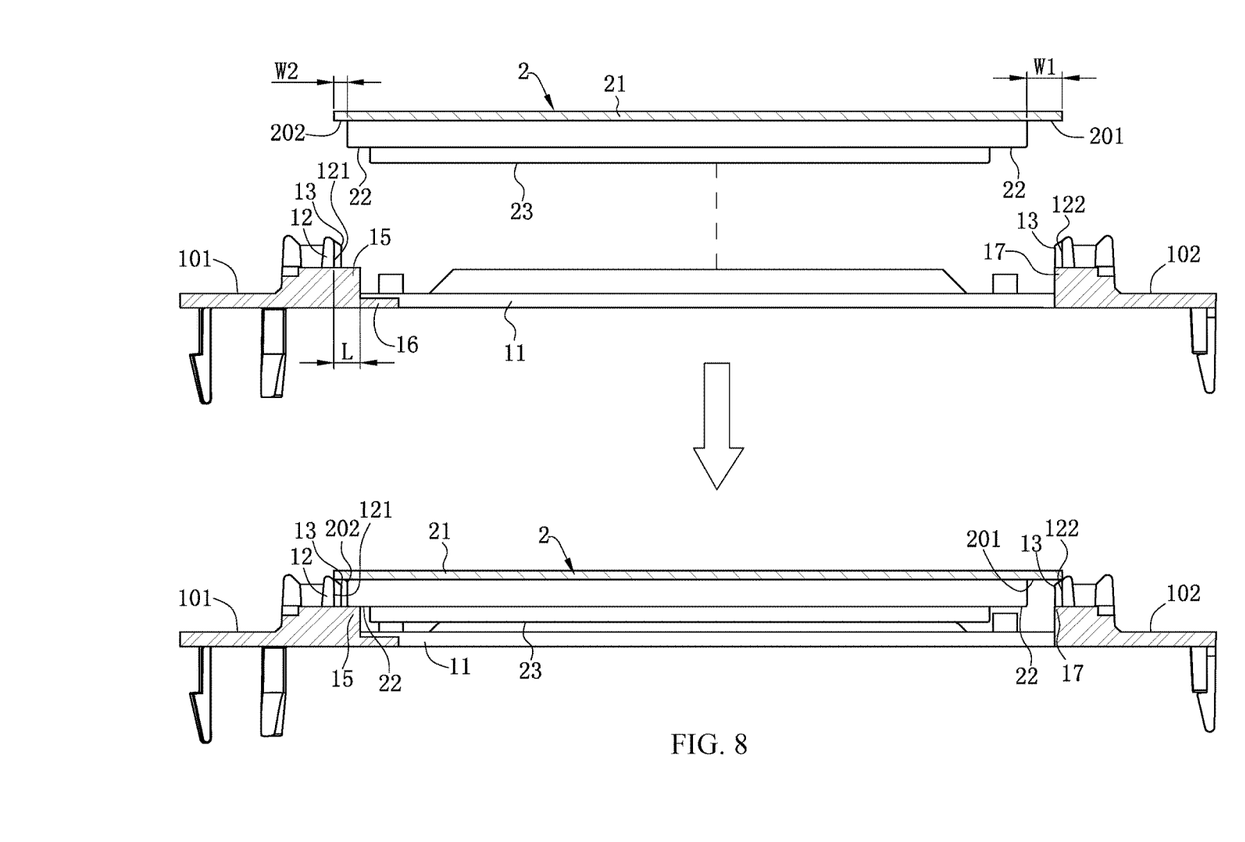
FIG. 8 is a schematic cross-sectional view of interference between a reversely installed chip module and a stopping block taken along line A-A according to certain embodiments of the present invention.

As shown in FIG. 7, the clamping component 1 is provided with two protruding blocks 17 at the right side of the opening 11, and the protruding blocks 17 downward abuts the second region 202. A distance L between a right side surface of the stopping block 15 to the first abutting surface 121 in the left-right direction is greater than the width W2 of the second region 202 in the left-right direction, and is shorter than the width W1 of the first region 201 in the left-right direction. Therefore, when the chip module 2 is correctly installed in the clamping component 1, the stopping block 15 is located above the first region 201, and the right side surface of the stopping block 15 does not interfere with a left side of the protruding blocks 17, thereby reducing resistance of installing the chip module 2 in the clamping component 1. As shown in FIG. 8, during a process in which the chip module 2 is installed in the clamping component 1 in an incorrect reverse left-right direction, the stopping block 15 abuts against and interferes with the protruding portion 22, and the stopping block 15 cannot abut against the second region 202, so that it is convenient for an operator to find and correct the mistake in time. In this embodiment, a gap between the right side surface of the stopping block 15 and the left side of the protruding portion 22 is smaller than the width of the second region 202 in the left-right direction, thereby increasing the area of the stopping block 15 that abuts the first region 201 as large as possible while preventing the right side surface of the stopping block 15 from interfering with the left side the protruding portion 22. Preferably, a distance L from the right side surface of the stopping block 15 to the first abutting surface 121 in the left-right direction is 2 mm. In another embodiment, the distance L from the right side surface of the stopping block 15 to the first abutting surface 121 in the left-right direction may be equal to the width W1 of the first region 201 in the left-right direction, provided that the stopping block 15 can abut the first region 201. This is not limited herein.

As shown in FIG. 4 and FIG. 6, the second frame 102 extends leftward to form two protruding blocks 17. The two protruding blocks 17 and the two stopping blocks 15 are disposed in two rows in the front-rear direction, and the protruding blocks 17 downward abut the second region 202. The upper surface of the first frame 101 is provided with a slugged groove 18 right at the left side of each limiting portion 16 and right above the stopping block 15, so that it is convenient for injection molding of the clamping component 1.

In conclusion, the clamping component 1 according to certain embodiments of the present invention has the following beneficial effects:

1. The distance between the right side face of the stopping block 15 and the first abutting surface 121 in the left-right direction is greater than the width of the second region 202 in the left-right direction, and is shorter than or equal to the width of the first region 201 in the left-right direction. Thus, the stopping block 15 can abut only the first region and not the second region 202. Therefore, when an operator installs the chip module 2 in the clamping component 1 in an incorrect reverse left-right direction, the stopping block 15 is located above the second region 202, and the stopping block 15 abuts the protruding portion 22 during a process in which the chip module 2 moves upward, so that the clamping component 1 cannot clamp the chip module 2, allowing the operator to find in time that the chip module 2 is installed in the incorrect direction, and thereby ensuring correctness of the direction in which the clamping component 1 clamps the chip module 2.

2. The gap between the right side surface of the stopping block 15 and the left side of the protruding portion 22 is smaller than the width of the second region 202 in the left-right direction, thereby increasing the area of the stopping block 15 that abuts the first region 201 as large as possible while preventing the right side surface of the stopping block 15 from interfering with the left side the protruding portion 22.

3. On the premise that the stopping block 15 abuts against the first region 201, the limiting portion 16 is not in contact with the upper surface of the protruding portion 22, thereby avoiding that the height and the size of the stopping block 15 and the limiting portion 16 needs to be strictly controlled to ensure that the limiting portion 16 is in contact with the upper surface of the protruding portion 22, and lowering difficulty of processing the clamping component 1.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A clamping component, configured to clamp a chip module, the chip module having a circuit board and a protruding portion protruding upward from an upper surface of the circuit board, wherein a region from a left side of the circuit board to a left side of the protruding portion is defined as a first region, a region from a right side of the circuit board to a right side of the protruding portion is defined as a second region, and a width of the first region in a left-right direction is greater than a width of the second region in the left-right direction, the clamping component comprising:
   an opening, configured to accommodate the chip module;
   a first abutting surface and a second abutting surface, respectively located at a left side and a right side of the opening, and configured to respectively abut the left side and the right side of the circuit board to limit movement of the circuit board in the left-right direction; and
   a stopping block, located at the left side of the opening, and extending rightward to the left side of the protruding portion and extending beyond the left side of the circuit board, wherein when the chip module is installed in the clamping component and the circuit board abuts the first abutting surface and the second abutting surface, the stopping block is located above the first region, and a distance between a right side surface of the stopping block and the first abutting surface in the left-right direction is greater than the width of the second region in the left-right direction, and is shorter than or equal to the width of the first region in the left-right direction.

2. The clamping component according to claim 1, wherein the stopping block abuts the first region.

3. The clamping component according to claim 1, wherein a gap between the right side surface of the stopping block and the left side of the protruding portion is smaller than the width of the second region in the left-right direction.

4. The clamping component according to claim 1, wherein two stopping blocks are provided at the left side of the opening, the first abutting surface is located between the two stopping blocks, and gaps between the first abutting surface and the two stopping blocks are not equal.

5. The clamping component according to claim 1, wherein the clamping component is provided with at least one protruding block at the right side of the opening, and the protruding block downwardly abuts the second region.

6. The clamping component according to claim 2, wherein the clamping component is provided with a limiting portion extending rightward and beyond the left side of the protruding portion, the limiting portion is located above an upper surface of the protruding portion, and a distance between a bottom surface of the limiting portion and a bottom surface of the stopping block is greater than a distance between the upper surface of the protruding portion and the upper surface of the circuit board, so that the limiting portion is not in contact with the upper surface of the protruding portion.

7. The clamping component according to claim 6, wherein the stopping block is at least partially located right below the limiting portion.

8. The clamping component according to claim 6, wherein a length of the limiting portion in a front-rear direction is equal to a length of the stopping block in the front-rear direction.

9. The clamping component according to claim 1, wherein the left side and the right side of the opening respectively extend downward to form two elastic arms, side surfaces of the two elastic arms opposite to each other respectively form the first abutting surface and the second abutting surface, and an end of each of the two elastic arms is bent to form a hook that hooks a lower surface of the circuit board.

10. The clamping component according to claim 9, wherein each of the elastic arms is provided with a protruding post, the protruding post of each of the elastic arms is provided with an arc surface, the left side of the circuit board is provided with a notch matching the arc surface, and the stopping block is closer to the left side of the protruding portion than the protruding post of each of the elastic arms.

\* \* \* \* \*